(12) United States Patent
Plummer

(10) Patent No.: US 6,731,126 B2
(45) Date of Patent: May 4, 2004

(54) APPARATUS FOR MONITORING A DEVICE POWERED BY THE APPARATUS, AND A METHOD FOR MONITORING A DEVICE FROM ITS POWER DRAW

(75) Inventor: Allan P. Plummer, Balcatta (AU)

(73) Assignee: Signal Data Systems Pty Ltd., Balcatta (AU)

( * ) Notice: Subject to any disclaimer, the term of this patent is extended or adjusted under 35 U.S.C. 154(b) by 209 days.

(21) Appl. No.: 09/953,444

(22) Filed: Sep. 17, 2001

(65) Prior Publication Data

US 2002/0033709 A1 Mar. 21, 2002

(30) Foreign Application Priority Data

Sep. 19, 2000 (AU) .............................................. PR 0237

(51) Int. Cl.⁷ .............................................. G01R 31/26
(52) U.S. Cl. .................... 324/765; 324/158.1; 327/110; 340/310.01
(58) Field of Search ........................ 324/765, 768–789, 324/7.72, 158.1; 310/90.5, 94; 318/293, 599; 327/110, 124; 340/310.1

(56) References Cited

U.S. PATENT DOCUMENTS

| 3,818,466 A | 6/1974 | Honda |
| 4,131,882 A | 12/1978 | Hollabaugh et al. |
| 4,348,582 A | 9/1982 | Budek |
| 4,400,688 A | 8/1983 | Johnston et al. |
| 4,684,920 A | 8/1987 | Reiter |
| 4,985,666 A | * 1/1991 | Nakabayashi ................ 318/434 |
| 4,988,972 A | 1/1991 | Takagi |
| 5,079,924 A | * 1/1992 | van der Broeck et al. ........ 62/6 |
| 5,493,267 A | 2/1996 | Ahlse et al. |
| 5,552,683 A | * 9/1996 | Dargent ....................... 318/287 |
| 6,005,316 A | * 12/1999 | Harris ......................... 310/90.5 |
| 6,097,761 A | 8/2000 | Bühring et al. |
| 6,229,432 B1 | 5/2001 | Fridley et al. |
| 2002/0053970 A1 | 5/2002 | Plummer |

FOREIGN PATENT DOCUMENTS

| AU | A-89555/98 | 5/1999 |
| AU | 73334 | 5/2001 |

* cited by examiner

Primary Examiner—Minh N. Tang
(74) Attorney, Agent, or Firm—Nixon & Vanderhye PC

(57) ABSTRACT

An apparatus for monitoring a device (such as a solenoid) powered by the apparatus includes a power supply for providing an alternating power signal to the device and a monitoring circuit that measures a prescribed characteristic of the alternating power signal. A control circuit is responsive to measurements from the monitoring circuit and is arranged to analyze the measurements to determine the status of the device therefrom.

21 Claims, 2 Drawing Sheets

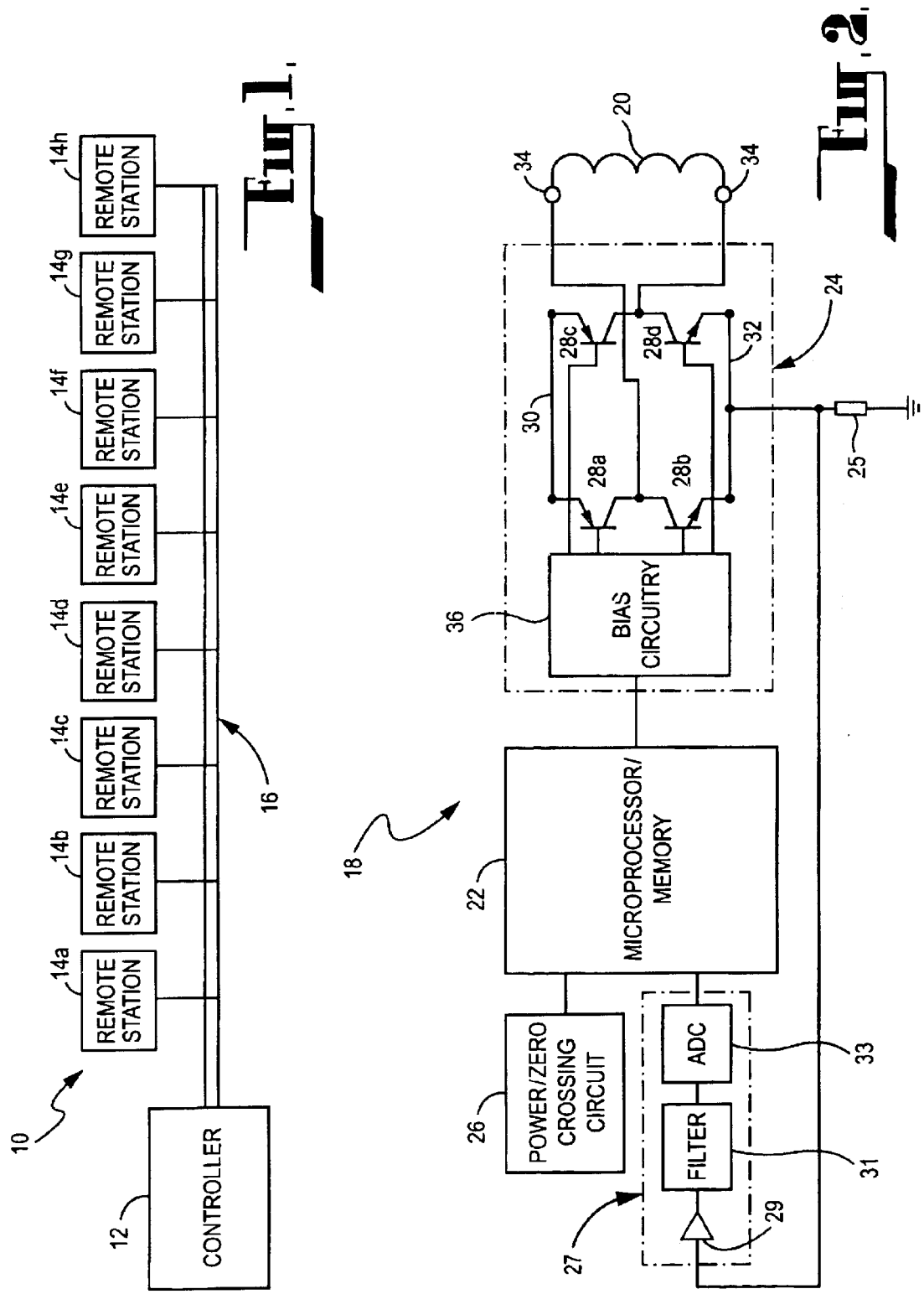

APPARATUS FOR MONITORING A DEVICE POWERED BY THE APPARATUS, AND A METHOD FOR MONITORING A DEVICE FROM ITS POWER DRAW

FIELD OF THE INVENTION

This invention relates to an apparatus for monitoring a device powered by the apparatus, and a method for monitoring a device from its power draw. The invention is particularly useful in the field of irrigation systems, however the invention may also be applied to other fields.

BACKGROUND ART

In many areas of the world the availability of water to maintain the natural growth of plants is either insufficient or unreliable, especially if the plants are not native to the area. For centuries this problem has been overcome by the development of irrigation systems where water is transferred from a local available source such as a river, dam or bore and used to artificially irrigate the plants.

The twentieth century has seen the further development of irrigation systems to the level of total computerised automation. This has resulted in many areas of the world having large tracts of previously unusable, arid land that are now capable of producing crops of all types.

A typical irrigation system comprises a network of underground pipes along which water is pumped. Selected valves at strategic points on this network, when activated, release water to local distribution points such as sprinklers or drippers. The method of activating these valves may vary, but typically they would be triggered by electrical, mechanical, hydraulic or manual means.

The most common electrical device is an electromechanical solenoid. An activating current causes the solenoid to move a spring-loaded plunger, allowing the valve to open due to the water pressure in the irrigation pipes. When this current is either removed or possibly reversed, the plunger returns to its original state thus allowing the valve to close.

The solenoids are activated, either directly or remotely, by an electrical or electronic control system such as irrigation controllers, programmable logic controllers (PLC's) or even manual switches.

The most common form of irrigation solenoid is activated on application of a voltage of 24 volts AC. Other solenoids activate on a range of different voltages from 6 to 48 volts, either being AC or DC. In order to minimise power consumption, latching solenoids are available which enable on the receipt of a voltage pulse of one polarity and disable when a voltage pulse of the reverse polarity is received.

The typical means of transferring the current required to activate these solenoids are a pair of cables running for distances of up to two kilometers from the controlling system. The limitations on this distance are dependent on the resistance of the cable such that sufficient power is available to activate the solenoid for the required time.

Commercial irrigation sites such as farms, parks or golf courses can cover large areas, consequently the length of cabling required to service all the solenoids may run to many kilometers. Currently there are two main techniques in use to distribute power to the solenoids, referred to as 'Direct Connection' and 'Two-Wire'. A brief description of these techniques follows.

Direct connection is the older or more traditional method, which is to supply power directly from an activating relay (or similar electronic device) within a control system by a directly connected pair of cables. It should be noted that the word 'pair' only refers to the connection point at the solenoid, as the typical wiring layout of such an installation is normally a matrix of single cables with the 'pairs' only occurring at the required solenoid junction locations.

Two-wire systems provide both power and activating commands along a single network. This network generally consists of a true 'pair' of cables and each solenoid within the network is activated by a corresponding decoder connected between it and the network. A master irrigation controller powers and issues commands to the decoders via the pairs of cables. The format of the command communications depends on the manufacturer's preference. Many existing systems utilise tone or DTMF (Telephone-type tones) signals superimposed on the powering voltage. Normally (and preferably) the network is wired in a 'point to point' configuration between the master irrigation controller and the decoders.

Most control systems activate solenoids by applying a 24 v AC 50 Hz RMS power signal to the solenoid. Although this technique appears both obvious and simple, a number of problems and limitations do occur.

A typical solenoid used requires around 3 watts at 24 v AC to hold in, resulting in a holding current of around 300 mA. When the solenoid is activated, the inrush current can be double (or more) the holding current. The inrush current must be maintained until the plunger has fully seated.

One example of inrush current increase in duration is where a solenoid plunger is clogged with sediment or sand. On activation, if the force of the solenoid is not sufficient to move the clogged plunger, the plunger would vibrate violently at the waveform frequency and could take a number of seconds to activate. In this case the instantaneous inrush current would have to be maintained for far longer periods before the solenoid would be fully activated. If this solenoid was being activated some distance from the voltage source (the irrigation controller) or if other solenoids were also being activated which used common cabling runs, the resistance of the wire could cause the following scenarios to occur:

The solenoid would not activate.

The voltage drop and solenoid-induced interference at the decoder could be sufficient to cause the decoder electronics to reset, fail, or run unreliably.

If the irrigation controller is equipped with current sensing, it could shut down the section being irrigated and skip to the next section.

The current drawn (under worst cases) could cause a fuse to blow or trip at the irrigation controller. In this case irrigation could be suspended or cancelled.

DISCLOSURE OF THE INVENTION

Throughout the specification, unless the context requires otherwise, the word "comprise" or variations such as "comprises" or "comprising", will be understood to imply the inclusion of a stated integer or group of integers but not the exclusion of any other integer or group of integers.

In accordance with a first aspect of this invention, there is provided an apparatus for monitoring a device powered by the apparatus, comprising:

Power means arranged to provide an alternating power signal to the device;

Monitoring means arranged to measure a prescribed characteristic of said alternating power signal; and Control means responsive to said measurements from the monitoring means and arranged to analyse said measurements to determine the status of the device therefrom.

Preferably, the control means is arranged to restart its analysis each one-half cycle of the alternating power signal.

Preferably, said prescribed characteristic is current.

Preferably, the control means is arranged to determine from a previous measurement and the current measurement whether any deviation in the prescribed characteristic exceeds a tolerance value.

Preferably, the control means is arranged to increment a first counter if the prescribed characteristic exceeds the tolerance value.

Preferably, the control means is arranged to increment a second counter if the prescribed characteristic does not exceed the tolerance value.

Preferably, the control means is arranged to calculate an incline value between the current measurement and the previous measurement, and to compare this incline value to a previously calculated incline value, where if the difference between the two incline values is greater than a tolerance value, the control means increments the first counter, otherwise the control means increments the second counter.

Preferably, at the end of each half cycle of the alternating power signal, the control means is arranged to compare the values of the first and second counters and to determine therefrom whether the device is in a first state or a second state.

Preferably, at the end of each half cycle the alternating power signal, the control means is also arranged to compare a maximum current drawn during the half cycle to a threshold value, and if the threshold value is exceeded to determine that the device is in a third state.

In accordance with a second aspect of this invention, there is provided a method for monitoring a device from its power draw, comprising:

providing an alternating power signal to the device;

measuring a prescribed characteristic of said alternating power signal; and analysing said measurements to determine the status of the device therefrom.

Preferably, the method further comprises the step of restarting the analysis each one-half cycle of the alternating power signal.

Preferably, said prescribed characteristic is current.

Preferably, the step of analysing comprises determining from a previous measurement and the current measurement whether any deviation in the prescribed characteristic exceeds a tolerance value.

Preferably, the step of analysing further comprises the step of counting how often the prescribed characteristic exceeds the tolerance value.

Preferably, the step of analysing further comprises the step of counting how often the prescribed characteristic does not exceed the tolerance value.

Preferably, the step of analysing further comprises the step calculating the incline between the current measurement and the previous measurement, and to compare this incline value to a previously calculated incline value, and counting how often the difference between the two incline values is greater than, and not greater than, a tolerance value.

Preferably, the step of analysing further comprises comparing, at the end of each half cycle of the alternating power signal, the counts of how often the tolerance value is exceeded to determine therefrom whether the device is in a first state or a second state.

Preferably, the step of analysing further comprises comparing, at the end of each half cycle of the alternating power signal, a maximum current drawn during the half cycle to a threshold value, and if the threshold value is exceeded to determine that the device is in a third state.

BRIEF DESCRIPTION OF THE DRAWINGS

One embodiment of this invention will now be described, by way of example, with reference to the accompanying drawings, in which:

FIG. 1 shows a system of a controller and remote stations in accordance with the preferred embodiment of this invention;

FIG. 2 shows a block diagram of the remote station shown in FIG. 1; and

BEST MODES FOR CARRYING OUT THE INVENTION

Figure 3:
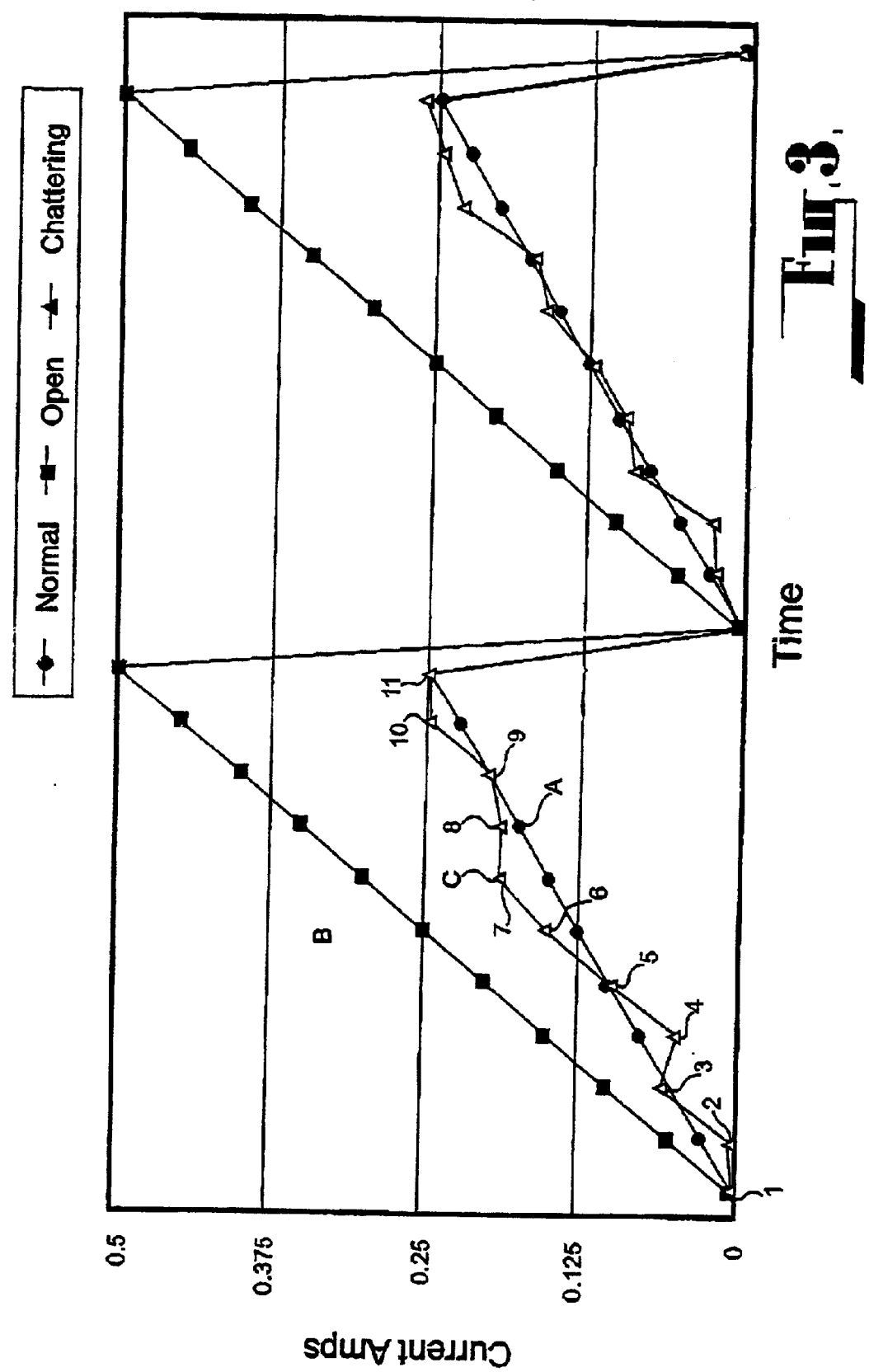
FIG. 3 shows an example of the current provided by the remote station.

The embodiment will be described with reference to a remote station used in an irrigation system, however it should be appreciated that the invention may well have application in other areas.

FIG. 1 shows an irrigation system 10 comprising a controller 12 and eight remote stations 14a–14h.

The remote stations 14a–14h are connected to the controller 12 by a pair of wires 16. The controller 12 provides power and instructions to the remote stations 14a–14h over the pair of wires 16. The remote stations 14a–14h are connected in parallel across the pair of wires 16.

In the embodiment, the remote stations 14a–14h each comprise a decoder 18 and a solenoid 20 which, when activated, irrigates an area of land. Although the irrigation system 10 is described with reference to a single pair of wires 16 and eight remote stations, it should be appreciated that the number of remote stations will vary according to the area of land to be irrigated.

FIG. 2 is a block diagram of one of the remote stations. Each of the remote stations 14a–14h are of the same general form as that shown in FIG. 2.

Each remote station comprises a decoder 18 formed from a power and zero crossing circuit 26, a microprocessor and associated memory 22 and a power generation circuit 24.

The power and zero crossing circuit 26 is connected to the pair of wires 16. The power and zero crossing circuit 26 produces a local power supply from the power signal on the pair of wires 16 for use by the decoder 18. The power and zero crossing circuit 26 also produces a signal indicating when the power signal changes polarity, which is input to the microprocessor 22 to decode instructions from the controller.

The power generation circuit 24 comprises an H-Bridge circuit in the embodiment formed from four power MOSFETs 28a–28d. The power MOSFETs 28a and 28b are connected in series between a power rail 30 and a second rail 32 that is connected to ground via a resistor 25. The power MOSFETs 28c and 28d are also connected in series between the power rail 30 and the second rail 32, in parallel with the power MOSFETs 28a and 28b. A pair of terminals 34 are provided, one connected between the power MOSFETs 28a and 28b, and one connected between the power MOSFETs 28c and 28d, as shown in FIG. 2. The terminals 34 are connected to a solenoid 20. By activating the power MOS- FETs 28*a* and 28*d*, and then alternately activating the power MOSFETs 28*c* and 28*b*, an alternating power signal is provided to the solenoid 20. The power MOSFETs 28*a*–28*d* are activated under control of the microprocessor 22 via appropriate bias circuitry 36.

The decoder 18 further comprises a current sense circuit 27 comprising an amplifier 29, a filter 31 and an analog to digital converter (ADC) 33. The input of the amplifier 29 is connected to the second rail 32, and accordingly the voltage at the input of the amplifier 29 is equal to that across the resistor 25, which is proportional to the current being drawn by the power generation circuit 24 including the solenoid 20. The output of the amplifier 29 is connected to the filter 31, the output of which is connected to the ADC 33. The digital output of the ADC 33 is input to the microprocessor 22. In other embodiments, where the microprocessor 22 has an analog input, some of the components in the current sense circuit 27 may be performed within the microprocessor 22.

In use, the microprocessor 22 controls the power generation circuit 24 to produce an alternating power signal for the solenoid 20 when it is desired to activate the solenoid 20.

The decoder 18 generates a DOC internal power supply from the power signal received via the pair of wires 16. By switching the MOSFETs 28*a* and 28*d* on, and alternately switching on the MOSFETs 28*c* and 28*b*, the microprocessor 22 is able to produce a substantially square-wave alternating power signal for the solenoid 20. In the embodiment, the alternating power signal is a substantially square wave, 50 Hz power signal.

The microprocessor 22 monitors the current drawn by the solenoid 20 by measuring the voltage across the resistor 25 using the current sensing circuit 27. Since the value of the resistor 25 is known, the current drawn by the solenoid 20 can be calculated simply using Ohms law.

When a constant DC voltage is applied to the solenoid 20, the current drawn by the solenoid 20 will increase substantially linearly until the inductive reactance of the coil has no further effect, at which point the current drawn remains constant.

Since the polarity of the voltage applied to the solenoid 20 is alternated at 50 Hz, the current drawn by the solenoid does not have an opportunity to reach its maximum level before the voltage polarity is reversed. Consequently, under normal operating conditions, the current drawn by the solenoid 20 will appear similar to a sawtooth waveform.

FIG. 3 is a graph showing three types of waveforms of current drawing patterns typically produced by solenoids in one of three states. The first curve, labelled A represents the sawtooth waveform produced by a solenoid operating normally.

The curve labelled B in FIG. 3 represents a solenoid that has its plunger stuck open. In this case the current drawn by the solenoid is much higher than the solenoid under normal operating conditions, because the impendence of the coil is lower when the plunger is not received within the coil.

The third waveform shown in FIG. 3 labelled C represents a solenoid whose plunger is chattering. In this condition, the plunger is constantly moving within the coil, resulting in a distorted waveform as the impendence of the coil in the solenoid is constantly varying.

To monitor the state of the solenoid 20, the microprocessor 22 samples the current drawn by the solenoid 20 using the current sensing circuit 27. The points at which the current is sampled are shown in FIG. 3 as the markings along each of the curves A, B and C.

When the alternating power signal reverses polarity, the current drawn by the solenoid decreases to zero, and the microprocessor 22 initialises its analysis. This includes resetting a within_threshold_counter variable to zero and an exceed_threshold_counter variable to zero.

The microprocessor 22 then takes the next two samples, shown in FIG. 3 as the points 1 and 2. From these samples, the value of the current drawn in sample 1 is stored in the variable previous_current and the value of that current drawn at sample 2 is stored in the variable current.

Next, the slope between the sample points 1 and 2 is calculated as the difference between the variables current and previous_current, divided by the time difference between the samples. This value is stored in the variable incline.

The value of the variable current is then stored in the variable previous_current and the value of the variable incline is then stored in a variable previous_slope.

When the next sample, point 3, is taken, the following steps are performed.

First, the value of the current at sample point 3 is stored in the variable current.

Next, the incline between the sample points 2 and 3 is calculated as current minus previous_current divided by time difference, and this value is stored in the variable incline.

Next, the difference between the variable incline and previous_incline is calculated and compared with a threshold value. If the difference exceeds the threshold value, the variable exceed_threshold_counter is incremented, otherwise the variable within_threshold_counter is incremented.

The value of the variable incline is then copied into the variable previous_incline and the value of the variable current is copied into the variable previous_current.

The above process is repeated for sample points 4 through 11, inclusive.

When the alternating power signal again reserves polarity, the microprocessor 22 then analyses the value of the variables within_threshold_counter and exceed_threshold_counter as well as the maximum current drawn in order to determine the status of the solenoid.

In general, the maximum current is drawn at the last sample point, point 11. Thus, the value of the variable current which corresponds with the current at sample point 11 is compared with a current threshold which is set slightly above the normal maximum current drawn by the solenoid. If the current drawn at the sample point 11, indicated by the variable current exceeds this current threshold, then the solenoid is most likely in an open state, corresponding with curve B.

Otherwise, the value of the counters within_threshold_counter and exceed_threshold_counter are compared to each other and to programmable threshold values. Depending upon the result of this comparison, the microprocessor 22 can conclude whether the solenoid is operating normally, or whether it is chattering, corresponding to the curves A and C in FIG. 3, respectively.

This comparison can be achieved in a number of ways. For instance, the number of value of the exceed_threshold_counter variable can be compared to a threshold, which if exceeded, indicates that the solenoid is chattering. Alternatively, the value of the exceed_threshold_counter can be expressed as a fraction of the within_threshold_counter, and again compared with a threshold value to determine whether the solenoid is considered to be operating normally or chattering.

In the event that the microprocessor 22 determines that the solenoid is operating in an open condition or in a chattering condition, the decoder 18 can report this to the controller 12.

It should be appreciated that this invention is not limited to the particular embodiment described above.

The claims defining the invention are as follows:

1. An apparatus for monitoring a solenoid powered by the apparatus, comprising:

power means arranged to provide an alternating power signal to the solenoid;

monitoring means arranged to measure a prescribed characteristic of the alternating power signal; and control means responsive to measurements from the monitoring means and arranged to analyse the measurements to determine the status of the solenoid therefrom.

2. The apparatus of claim 1, wherein the control means is arranged to restart its analysis each one-half cycle of the alternating power signal.

3. The apparatus of claim 1, wherein the prescribed characteristic is current.

4. The apparatus of claim 1, wherein the control means is arranged to determine from a previous measurement and a current measurement whether any deviation in the prescribed characteristic exceeds a first tolerance value.

5. The apparatus of claim 4, wherein the control means is arranged to increment a first counter if the prescribed characteristic exceeds the first tolerance value.

6. The apparatus of claim 4, wherein the control means is arranged to increment a second counter if the prescribed characteristic does not exceed the first tolerance value.

7. The apparatus of claim 4, wherein the control means is arranged to calculate an incline value between the current measurement and the previous measurement, and to compare this incline value to a previously calculated incline value, where if the difference between the two incline values is greater than the first tolerance value, the control means increments a first counter, otherwise the control means increments a second counter.

8. The apparatus of claim 7, wherein at the end of each half cycle of the alternating power signal, the control means is arranged to compare the values of the first and second counters and to determine therefrom whether the solenoid is in a first state or a second state.

9. The apparatus of claim 8, wherein at the end of each half cycle of the alternating power signal, the control means is also arranged to compare a maximum current drawn during the half cycle to a second threshold value, and if the second threshold value is exceeded to determine that the solenoid is in a third state.

10. A method for monitoring a solenoid from its power draw, comprising:

providing an alternating power signal to the solenoid;

measuring a prescribed characteristic of the alternating power signal; and analysing measurements of the prescribed characteristic to determine the status of the solenoid therefrom.

11. The method of claim 10, further comprising restarting the analysing each one-half cycle of the alternating power signal.

12. The method of claim 10, wherein the prescribed characteristic is current.

13. The method of claim 10, wherein the analysing comprises determining from a previous measurement and a current measurement whether any deviation in the prescribed characteristic exceeds a first tolerance value.

14. The method of claim 13, wherein the analysing further comprises counting how often the prescribed characteristic exceeds the first tolerance value.

15. The method of claim 13, wherein the analysing further comprises counting how often the prescribed characteristic does not exceed the first tolerance value.

16. The method of claim 13, wherein the analysing further comprises calculating the incline between the current measurement and the previous measurement, and to compare this incline value to a previously calculated incline value, and counting how often the difference between the two incline values is greater than, and not greater than, the first tolerance value.

17. The method of claim 16, wherein the analysing further comprises comparing, at the end of each half cycle of the alternating power signal, the counts of how often the first tolerance value is exceeded to determine therefrom whether the solenoid is in a first state or a second state.

18. The method of claim 17, wherein the analysing further comprises comparing, at the end of each half cycle of the alternating power signal, a maximum current drawn during the half cycle to a second threshold value, and if the second threshold value is exceeded to determine that the solenoid is in a third state.

19. An apparatus for determining a position of a moveable element of a solenoid, comprising:

a power supply circuit for providing an alternating power signal to the solenoid;

a measuring circuit for measuring a rate of change of current flow in the solenoid; and a control circuit for analyzing the measured rate of change of current flow to determine the position of the moveable element.

20. The apparatus of claim 19, wherein the moveable element comprises a plunger for activating a valve of an irrigation system.

21. The apparatus of claim 19, wherein the control circuit comprises a counter which is incremented based on a result of a comparison between the measured rate of change and a tolerance value, and the position of the moveable element is determined based on the count of the counter.

* * * * *